United States Patent

Yiu et al.

(10) Patent No.: US 6,589,864 B2
(45) Date of Patent: Jul. 8, 2003

(54) METHOD FOR DEFINING WINDOWS WITH DIFFERENT ETCHING DEPTHS SIMULTANEOUSLY

(75) Inventors: Gow-Zin Yiu, Ilan (TW); Tean-Sen Jen, Taoyuan (TW); Shao-Wu Hsu, Chiai (TW); Ming-Tien Lin, Taipei (TW); Ching-Lin Fan, Keelung (TW)

(73) Assignee: Hannstar Display Corp., Taipei (TW)

( * ) Notice: Subject to any disclaimer, the term of this patent is extended or adjusted under 35 U.S.C. 154(b) by 0 days.

(21) Appl. No.: 09/803,855

(22) Filed: Mar. 12, 2001

(65) Prior Publication Data

US 2001/0034118 A1 Oct. 25, 2001

(30) Foreign Application Priority Data

Apr. 25, 2000 (TW) .................................. 89107782 A (51) Int. Cl.⁷ .......................................... H01L 21/4763
(52) U.S. Cl. .................. 438/637; 438/49; 438/620; 438/695; 438/700; 438/702
(58) Field of Search ................... 438/620, 694, 438/695, 696, 700, 701, 702, 637, 672, 675, 149, 151, 153, 154; 430/5, 317, 494, 313, 312

(56) References Cited

U.S. PATENT DOCUMENTS 5,741,624 A * 4/1998 Jeng et al. .................. 430/312
5,976,968 A * 11/1999 Dai ............................. 438/622

FOREIGN PATENT DOCUMENTS

| EP | 0220578 | * 10/1986 |
| JP | 63230889 | * 9/1988 |
| JP | 8279488 | * 10/1996 |

* cited by examiner

Primary Examiner—Carl Whitehead, Jr.
Assistant Examiner—Thanhha Pham
(74) Attorney, Agent, or Firm—Volpe and Koenig, P.C.

(57) ABSTRACT

A method for defining plural windows with different etching depths simultaneously is disclosed. The method includes steps of (a) forming a photoresist on a substrate having a multiple film structure thereon, (b) exposing a first region of the photoresist to a first exposure dose and a second region of the photoresist to a second exposure dose, (c) obtaining different remaining thicknesses of the photoresist on the first region and the second region by a development, and (d) etching the first region and the second region of the photoresist for forming the plural windows with different etching depths of the multiple film structure.

8 Claims, 9 Drawing Sheets

METHOD FOR DEFINING WINDOWS WITH DIFFERENT ETCHING DEPTHS SIMULTANEOUSLY

FIELD OF THE INVENTION

The present invention relates to a method for defining windows with different etching depths simultaneously, and more particularly to one for used in the process of the thin film transistor.

BACKGROUND OF THE INVENTION

Figure 1:
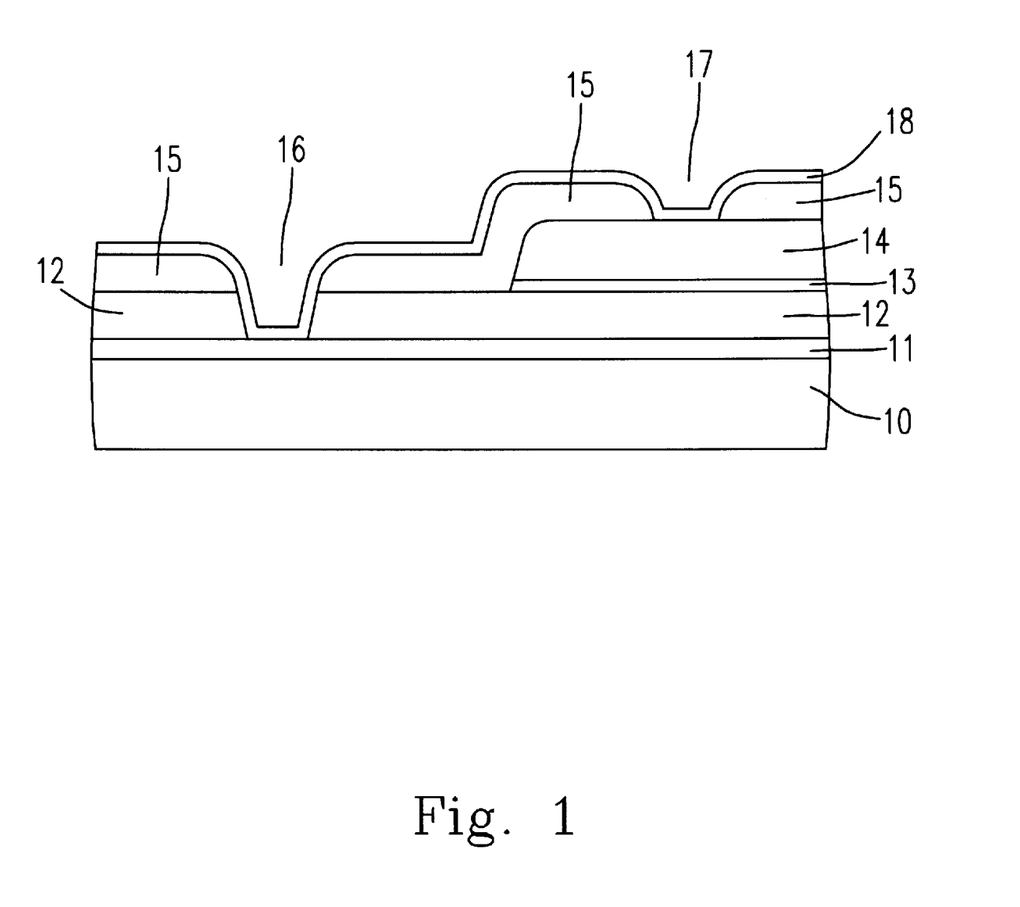
FIG. 1 is a cross sectional view illustrating a contacting structure of a gate conducting layer and a data conducting layer for a thin film transistor liquid crystal display (TFT-LCD) according to the prior art.

For the structure of the currently developed thin film transistor liquid crystal display (TFT-LCD), the cross sectional view thereof is generally as shown in FIG. 1. The structure includes a gate conducting layer 11, a gate insulating layer 12, high doping semiconductor layer 13, a data conducting layer 14 and a passivation 15, which are formed in order from bottom to top on a glass substrate 10. All these layers are essential. In addition, for electrically connecting the structure to the peripheral control circuits, a first contact window 16 is etched to connect to the gate conducting layer 11 and a second contact window 17 is etched to connect to the data conducting layer 14, and then a transparent electrode layer 18 is covered thereon for achieving electricity.

Generally, the first contact window 16 and the second contact window 17 are formed with the same photo mask by a photolithography etching process. However, the depths of two contact windows 16, 17 are different. The first contact window 16 has to pass through the passivation 15 and the gate insulating layer 12 to reach the gate conducting layer 11, while the second contact window only has to pass through the passivation 15 to reach the data conducting layer 14. Therefore, forming the two contact windows 16 and 17 having different depths at the same time needs an excellent processing control technology. In other words, the improper processing control will cause the insufficiently etched depth of the first contact window 16 or the over etched depth of the second contact window 17. The insufficiently etched depth of the first contact window 16 usually results in a bad electrical connection because partially the gate insulating layer 12 is remained. The over etched depth of the second contact window 17 also affects the electrical properties, because the structure in the vicinity thereof is damaged, the under cut condition is happened, or the data conducting layer 14 is damaged. Therefore, the purpose of the present invention is to develop a method to deal with the above situations encountered in the prior art.

SUMMARY OF THE INVENTION

It is therefore an object of the present invention to propose a method for defining plural windows with different etching depths of a multiple film structure simultaneously to avoid the bad electrical connection.

It is therefore another object of the present invention to propose a method for defining plural windows with different etching depths of a multiple film structure simultaneously to avoid the structure in the vicinity thereof damaged.

It is therefore an additional object of the present invention to propose a method for defining plural windows with different etching depths of a multiple film structure simultaneously to avoid the under cut condition happened.

It is therefore a further object of the present invention to propose a method for defining plural windows with different etching depths of a multiple film structure simultaneously to avoid the data conducting layer damaged.

It is therefore a yet object of the present invention to propose a method for defining plural windows with different etching depths of a multiple film structure simultaneously to increase the flexibility of the process and the yield of the product.

According to the present invention, the method for defining plural windows with different etching depths simultaneously includes steps of (a) forming a photoresist on a substrate having a multiple film structure thereon, (b) exposing a first region of the photoresist to a first exposure dose and a second region of the photoresist to a second exposure dose, (c) obtaining different remaining thicknesses of the photoresist on the first region and the second region by a development, and (d) etching the first region and the second region of the photoresist for forming the plural windows with different etching depths of the multiple film structure.

Certainly, the substrate can be an insulating substrate. The insulating substrate is preferably a transparent glass substrate and the multiple film structure is a thin film transistor circuit structure.

Certainly, the thin film transistor circuit structure can include a gate conducting layer, a gate insulating layer formed on the gate conductor layer, a high doping semiconductor layer formed on the gate insulating layer, a data conducting layer formed on the high doping semiconductor layer, and a passivation formed on the data conducting layer.

Certainly, the step (d) can include steps of non-selectively etching the first region and the second region simultaneously, and forming a first contact window connected to the gate conducting layer of the thin film transistor structure on the first region, and a second contact window connected to the gate conducting layer of the thin film transistor structure on the second region in response to the different remaining thicknesses of the photoresist.

When the first region of the photoresist has the remaining thickness of zero, the step (d) can include steps of performing a first selective etching of the first region and the second region, thereby allowing an exposure portion of the passivation of the first region to be etched and causing the second region covered by the photoresist unable to be etched, then performing a second selective etching of the first region and the second region, wherein the second region having the remaining photoresist is etched to expose the passivation, and then performing a third selective etching of the first region and the second region, wherein the first contact window connected to the gate conducting layer of the thin film transistor structure on the first region and the second contact window connected the gate conducting layer of the thin film transistor structure on the second region are formed.

Preferably, the step (b) include steps of providing a photo mask having a first penetrable region and a second penetrable region respectively corresponding to the first region and the second region of the photoresist, wherein the first penetrable region has a higher light-penetrability rate relative to that of the second penetrable region, and exposing the photoresist of the multiple film structure to an identical exposure dose for obtaining the first exposure dose and the second exposure dose by the photo mask with two different light-penetrability rates.

Preferably, the first penetrable region is a complete transparent region. The second penetrable region is an optical compensation film for blocking a portion of exposure dose to pass therethrough.

Certainly, the second penetrable region can be plural array mask patterns for blocking a portion of exposure energy to pass therethrough and resulting in a diffraction by a light which pass through the plural array mask patterns.

The present invention may best be understood through the following description with reference to the accompanying drawings, in which:

DETAILED DESCRIPTION OF THE PREFERRED EMBODIMENT

Figure 2:
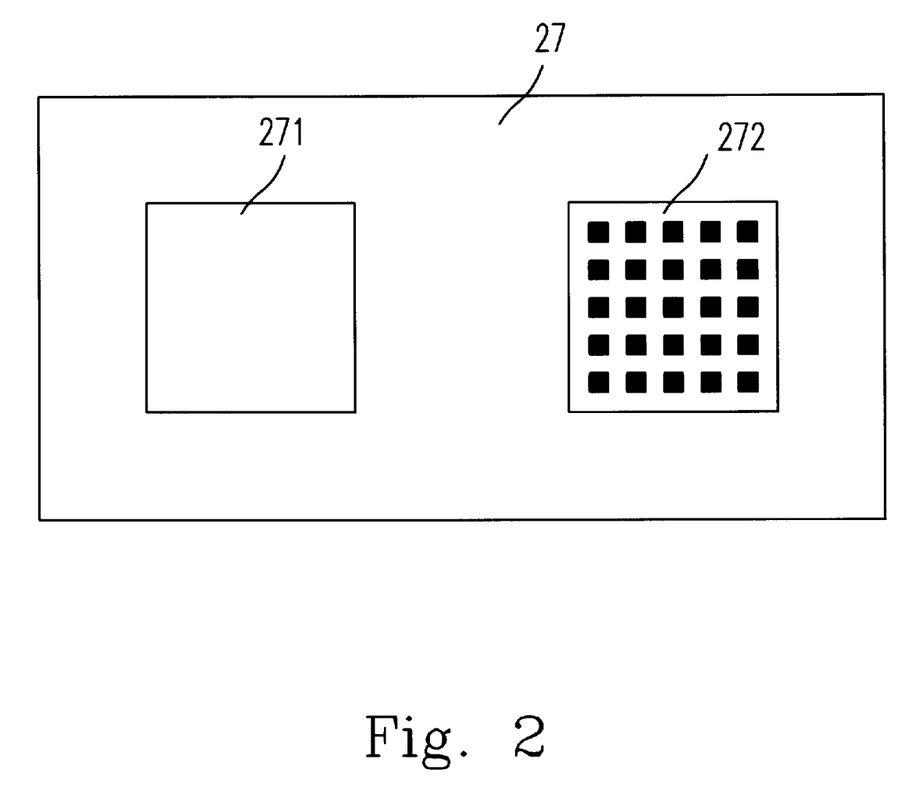
FIG. 2 is a schematic diagram illustrating a photo mask according to a preferred embodiment of the present invention.
Figure 3:
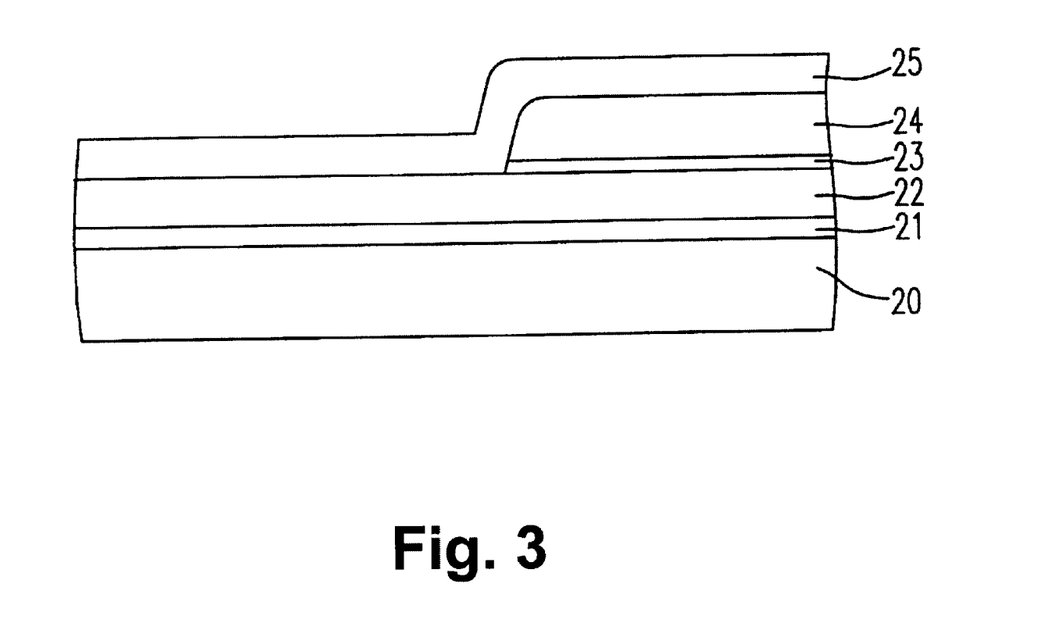
FIG. 3 is a cross sectional view of the multiple film structure of the present invention before the photoresist layer is formed.

FIG. 2 is a schematic view showing the photo mask used in the present invention. FIGS. 4A–4B and 5A–5D are schematic sectional views illustrating the steps of defining windows with different etching depths simultaneously according to the present invention. FIG. 3 is a cross sectional view indicating an insulating substrate 20, e.g. a transparent glass substrate, having a multiple film structure thereon for a thin film transistor circuit structure. The multiple film structure from bottom to top includes a gate conducting layer 21, a gate insulating layer 22, a high doping semiconductor layer 23, a data conducting layer 24, and a passivation 25.

Figure 4A:
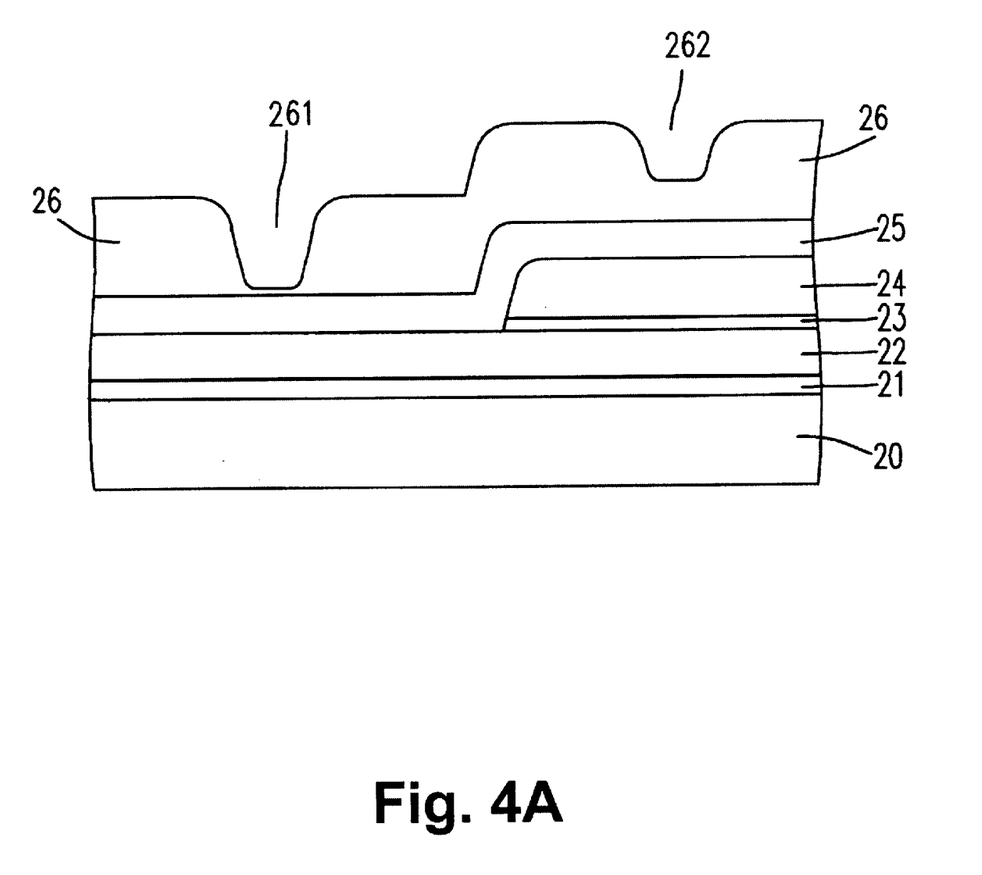
FIGS. 4A–4B are cross sectional views illustrating the steps of defining windows with different etching depths according to a first preferred method of the present invention.

As shown in FIG. 4A, a photoresist 26 is formed above the multiple film structure. After forming the photoresist 26, the photoresist 26 is exposed and developed according to a photo mask 27 shown in FIG. 2. The photoresist 26 includes a first region 261 and a second region 262. The photo cask 27 includes a first penetrable region 271 and a second penetrable region 272 corresponding to the first region 261 and the second region 262, respectively. The first penetrable region 271 has a higher light-penetrability rate relative to that of the second penetrable region 272. For example, the first penetrable region 271 is a complete transparent region, and the second penetrable region 272 is an optical compensation film or plural array mask patterns shown in FIG. 2. The plural array mask patterns are used for blocking a portion of exposure dose, thereby the lights which pass through the array mask patters causes a diffraction. Owing to the array mask patterns and the interval size thereof, the array mask patterns on the second region 262 cannot be analyzed clearly by the exposure and the development. Therefore, a remaining photoresist thickness between that of the complete exposure and that of the non-exposure can be formed in the second region 262.

Although the photoresist 26 formed on the multiple film structure is exposed to an identical exposure dose, a first exposure dose on the first region 261 and a second exposure dose on the second region 262 are obtained according to the photo mask 27 with two different light-penetrability rates. Subsequently, as shown in FIG. 4A, the different remaining thicknesses of the photoresist of the first region 261 and the second region 262 are obtained by a photoresist development.

Figure 4B:
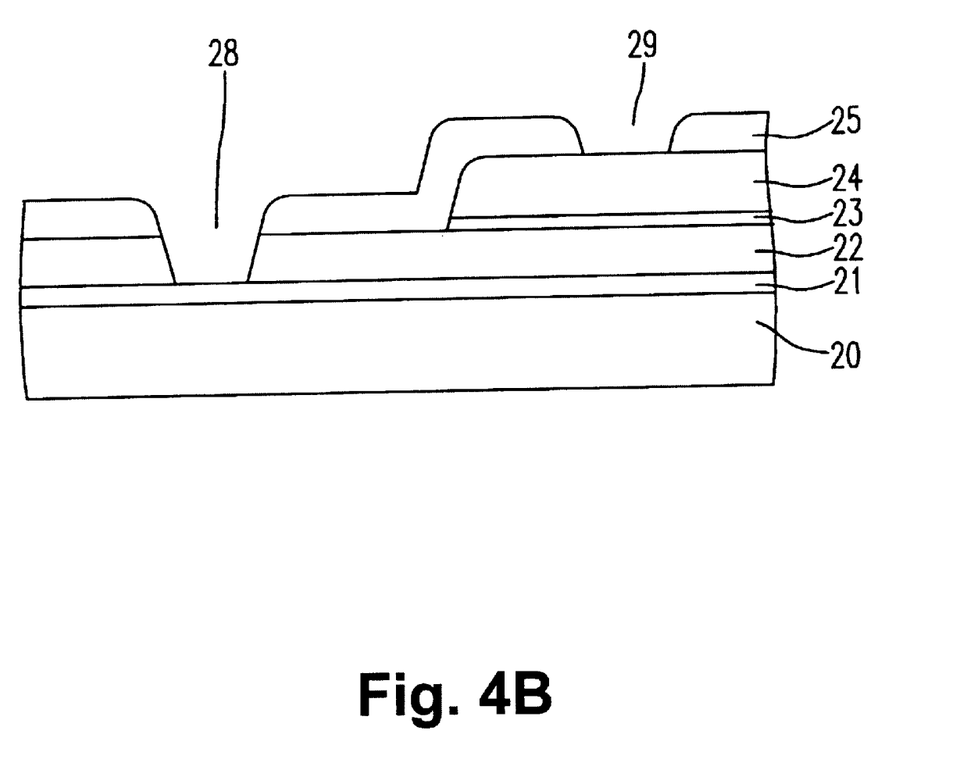

The etching process is employed to the photoresist of the first region 261 and the second region 262 with different remaining thicknesses, sequentially. The etching process includes two methods for achieving the demand. The first method includes steps of non-selectively etching the first region 261 and the second region 262 simultaneously and forming two contact windows 29, 28 connected to the data conducting layer 24 and the gate conducting layer 21, respectively, of the thin film resistor structure as shown in FIG. 4B. During the etching process, the second region 262 having thicker remaining photoresist (see FIG. 4A) will reduce the etching time for the passivation 25. Thus, two different etching depths in the first region 261 and the second region 262 are formed, thereby resulting in the two contact windows 29, 28 connected to the data conducting layer 24 and the gate conducting layer 21, respectively, of the thin film transistor structure.

Figure 5A:
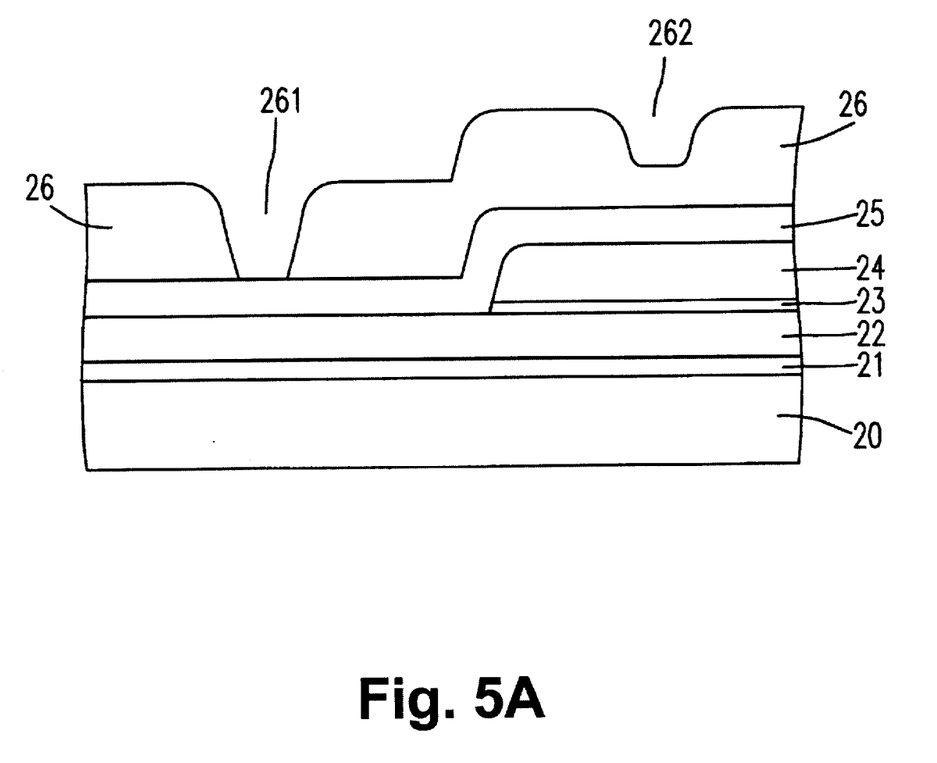
FIGS. 5A–5D are cross sectional views illustrating the steps of defining windows with different etching depths according to a second preferred method of the present invention.
Figure 5B:
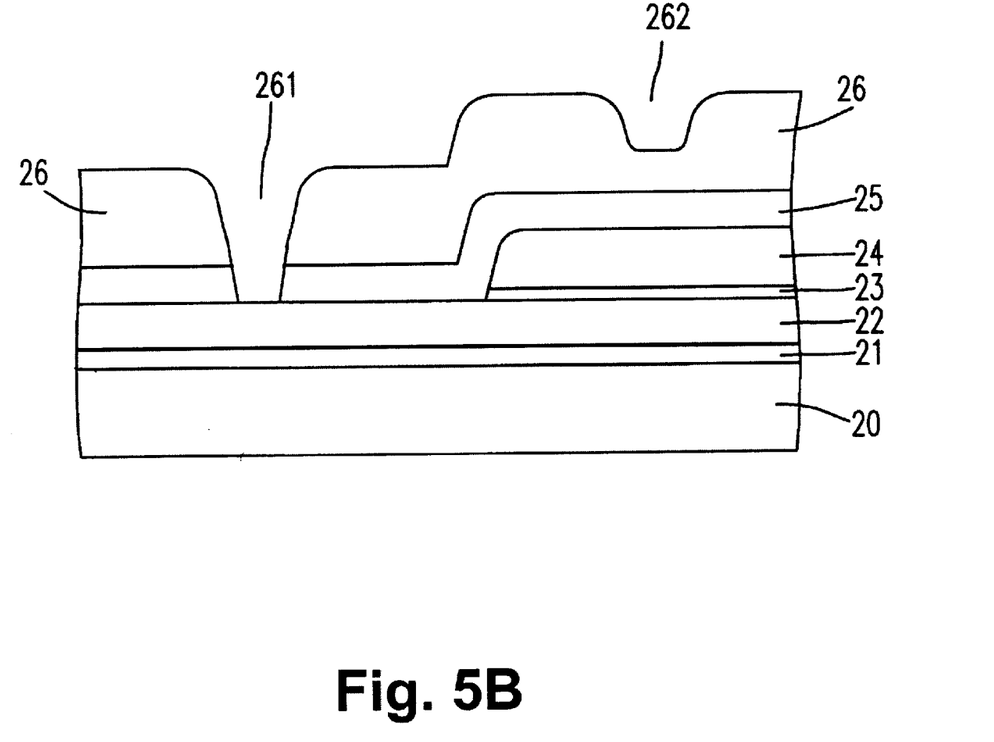
Figure 5C:
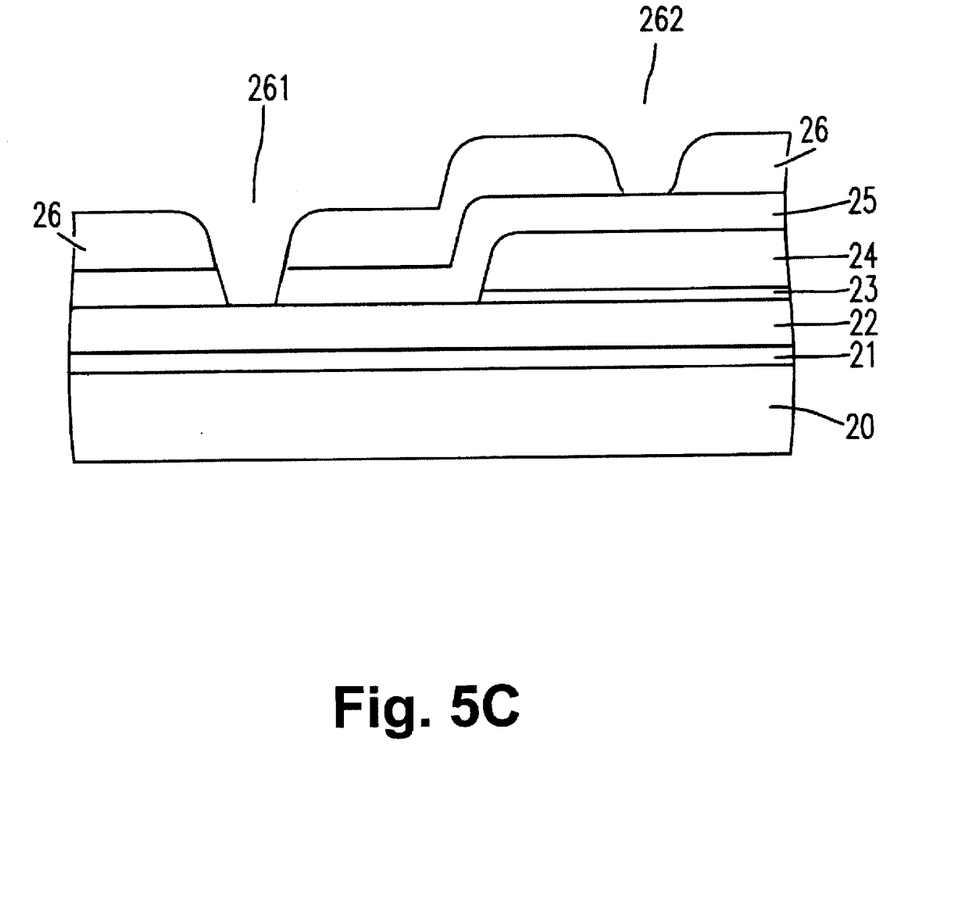
Figure 5D:
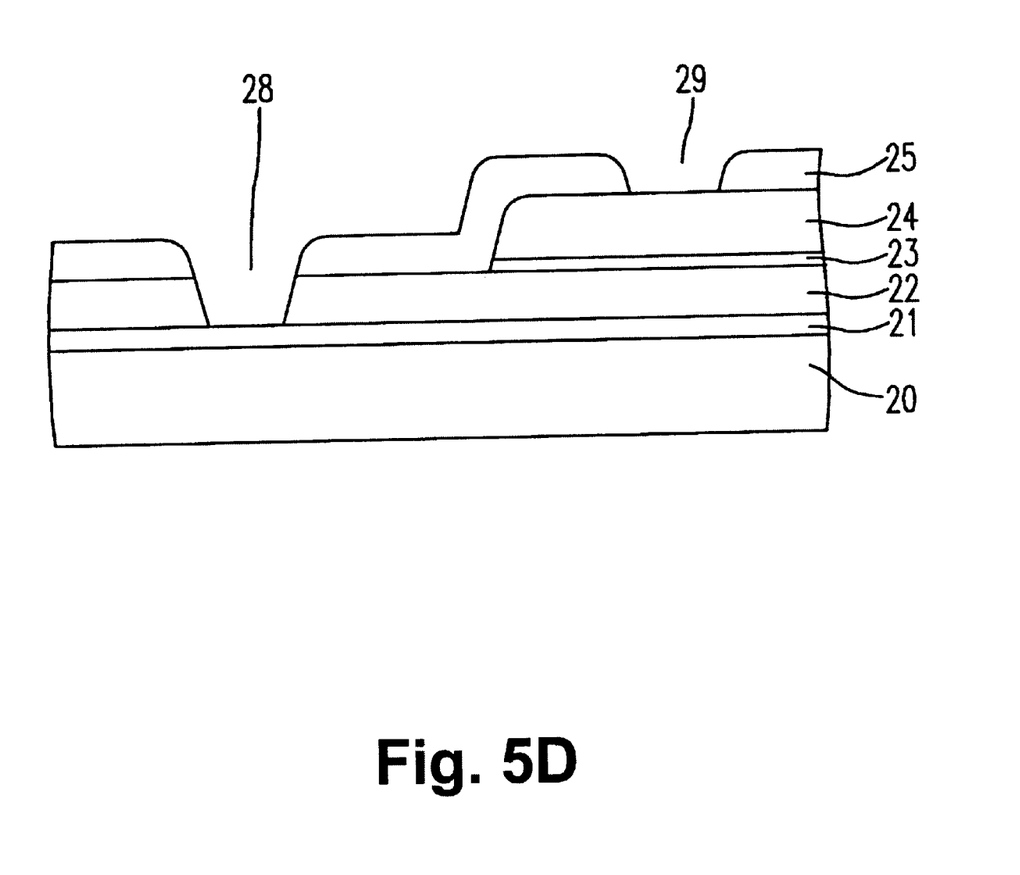

As shown in FIGS. 5A–5D, the second method is employed when the remaining thickness of the photoresist 26 of the first region 261 is zero (see FIG. 5A). First, as shown in FIG. 5B, the first region 261 and the second region 262 are simultaneously etched by a first selective etching, e.g. a dry etching. The second region 262 covered by the photoresist 26 cannot be etched, however, an exposed portion of the passivation 25 of the first region 261 is etched. As shown in FIG. 5C, after switching the etching gas such as oxygen, the region 261 and the second region 262 are then simultaneously etched by a second selective etching for removing the remaining photoresist of the second region 262 to expose the passivation 25. Subsequently, the etching gas is switched to a gas which is easy to etch the passivation 25 and the gate insulating layer 22. Hence, the first region 261 and the second region 262 are simultaneously etched by a third selective etching, shown in FIG. 5D, for forming two contact windows 29, 28 with different depths connected to the data conducting layer 24 and the gate conducting layer 21, respectively, of the thin film transistor structure.

In sum, the method of the present invention is more flexible while comparing with the prior art. Further, the present invention can increase the yield of the product.

While the invention has been described in terms of what are presently considered to be the most practical and preferred embodiments, it is to be understood that the invention need not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for defining plural windows with different etching depths simultaneously, comprising steps of:
   depositing a multiple film structure on a substrate, wherein said multiple film structure comprising a plurality of layers including a first metal conducting layer, a second metal conducting layer located above said first metal conducting layer, a first insulating layer located between said first and second metal conducting layers, and a second insulating layer located above the second metal conducting layer;

forming a photoresist above said multiple film structure;

providing a photo mask having a first penetrable region and a second penetrable region respectively corresponding to a first region and a second region of said photoresist, wherein said first penetrable region has a higher-penetrability rate relative to that of said second penetrable region;

exposing said first region of said photoresist to a first exposure dose and said second region of said photoresist to a second exposure dose;

obtaining different remaining thicknesses of said photoresist on said first region and said second region by a development; and non-selectively etching said first region and said second region of said photoresist to form first and second windows respectively in said multiple film structure, said first window extending to and exposing said first metal conducting layer, and said second window extending to and exposing said second metal conducting layer.

2. The method according to claim 1, wherein said substrate is an insulating substrate.

3. The method according to claim 2, wherein said insulating substrate is a transparent glass substrate.

4. The method according to claim 2, wherein said multiple film structure is a thin film transistor (TFT) circuit structure.

5. The method according to claim 4, wherein said first metal conducting layer comprises a gate conducting layer;

said first insulating layer comprises a gate insulating layer formed on said gate conducting layer;

said second metal conducting layer comprises a data conducting layer; and said first and second windows contacting with said gate conducting layer and said data conducting layer respectively.

6. The method according to claim 5, wherein said etching step comprises steps of:

non-selectively etching said first region and said second region simultaneously; and forming said first window contacting and connected to said gate conducting layer of said thin film transistor circuit structure under said first region, and said second window contacting and connected to said data conducting layer of said thin film transistor circuit structure under said second region in response to said different remaining thicknesses of said photoresist respectively.

7. The method according to claim 5, wherein said thin film transistor further comprises a high doping semiconductor layer formed on said gate insulating layer.

8. The method according to claim 1, wherein the second insulating layer comprises a passivation.

* * * * *